United States Patent [19]
Rolfson et al.

[11] Patent Number: 5,707,485
[45] Date of Patent: Jan. 13, 1998

[54] METHOD AND APPARATUS FOR FACILITATING REMOVAL OF MATERIAL FROM THE BACKSIDE OF WAFERS VIA A PLASMA ETCH

[75] Inventors: J. Brett Rolfson; William J. Crane, both of Boise, Id.

[73] Assignee: Micron Technology, Inc., Boise, Id.

[21] Appl. No.: 575,647

[22] Filed: Dec. 20, 1995

[51] Int. Cl.[6] .................................................. H01L 21/00
[52] U.S. Cl. ........................ 156/643.1; 156/345; 216/67
[58] Field of Search .......................... 156/345 P, 643.1, 156/662.1, 654.1; 437/225; 204/298.35; 216/67

[56] References Cited

U.S. PATENT DOCUMENTS 4,624,728  11/1986  Bithell et al. ............................ 156/345
4,908,095  3/1990  Kagatsume et al. ..................... 156/345
5,075,256  12/1991  Wang et al. ............................. 437/225

*Primary Examiner*—William Powell
*Attorney, Agent, or Firm*—Angus C. Fox, III

[57] ABSTRACT

The present invention is a method and apparatus, particularly adaptable to plasma etchers having horizontal base electrodes, for removing films such as silicon nitride from the backside of semiconductor wafers without leaving unetched residue or bumps thereon. Following the loading of a wafer in a plasma etch chamber, the wafer is positioned above the base electrode and within an etchant plasma for a period of time, with all portions of the front side surface and all portions of the back side surface of the wafer being subjected to the plasma for at least a portion of the period.

16 Claims, 3 Drawing Sheets

METHOD AND APPARATUS FOR FACILITATING REMOVAL OF MATERIAL FROM THE BACKSIDE OF WAFERS VIA A PLASMA ETCH

BACKGROUND OF THE INVENTION

1. Field of the Invention

This invention relates to plasma etching of semiconductor wafers in plasma reactors with powered wafer chucks. More particularly, it relates to apparatus and methods for removing material from the backside of a wafer undergoing a plasma etch in a horizontal position.

2. Description of Related Art

Integrated circuits are typically fabricated on a wafer of semiconductor material such as silicon or gallium arsenide. During the fabrication process, the wafer is subjected to an ordered series of steps, which may include photomasking, material deposition, oxidation, nitridization, ion implantation, diffusion and etching, in order to achieve a final product.

Two basic types of etching processes are currently used for integrated circuit manufacture. Wet etches employ aqueous solutions having a chemical component selected to attack the exposed surface of the material to be etched. For example, hydrofluoric acid solutions are commonly utilized to etch silicon dioxide. Both acidic and basic solutions are used extensively. Wet etches are almost always isotropic (i.e., omnidirectional), with the etch rate for a single material being relatively constant in all directions. An exception to isotropicity of wet etches may be observed when etching a single crystal material. For example, when a silicon wafer having a crystal orientation of 1,1,0 etched in a potassium hydroxide solution, the etch is bidirectional rather than omnidirectional.

Plasma etches, on the other hand, are dry etches, and may be either isotropic or anisotropic. Although the term "anisotropic" literally means "not omnidirectional", it has acquired the connotation "unidirectional" in the industry. As will be explained hereinafter, an anisotropic plasma etch is more accurately referred to as a reactive-ion-assisted plasma etch. Reactive-ion etches are commonly used to create spacers on vertical sidewalls of other layers, to transfer a mask pattern to an underlying layer with little or no undercutting beneath mask segment edges, and to create vertical-walled openings in insulative layers.

A plasma reactor, as a plasma etch apparatus is often called, is a vacuum chamber in which neutral gas molecules are ionized to form a plasma which may contain a number of species including metastables, free radicals, ions, atoms, and electrons. The molecular gas is selected so as to generate species which react either kinetically or chemically with the material to be etched. Because dielectric layers cannot be etched using a direct-current-induced glow discharge due to charge accumulation on the surface of the dielectric which quickly neutralizes the dc-voltage potential, most reactors are designed as radio-frequency diode systems and typically operate at a frequency of 13.56 Mhz, a frequency reserved for non-communication use by international agreement. However, plasma etch processes operating between 100 khz–80 Mhz have been used successfully.

Although there are both single-wafer and multi-wafer, or batch, plasma reactors, the single-wafer reactors tend to provide greater etch uniformity. There are several types of single-wafer etch reactors in common use today. Parallel-plate reactors, the first type to be developed, are the least complex.

A parallel-plate reactor has a disk-shaped base electrode to which the wafer is either mechanically or electrostatically affixed. A disk-shaped upper electrode that is larger than the base electrode is positioned above the wafer. After a flow of molecular gas into the etch chamber is established, a radio-frequency voltage in excess of the breakdown voltage of the molecular gas is applied between electrodes. Once the discharge is established, the electrical discharge between the electrodes may be maintained at a reduced voltage.

The electrical discharge between the electrodes consists of a glowing plasma region centered between base electrode and upper electrode, a lower dark space between the base electrode and the plasma region, and an upper dark space region between the upper electrode and the plasma region. The dark space regions are also known as "sheath" regions. As excited electrons in the plasma species relax and fall back to more stable orbitals, energy is released in the form of light. This light gives the plasma region its characteristic glow.

As the voltage drop through the plasma is small in comparison to the voltage drops through either of the dark spaces, acceleration of ions within the plasma is minimal, and those plasma ions which are accelerated from the plasma to one of the plates are primarily those that happen to be on the edge of one of the dark spaces. Although ions are accelerated toward both electrodes, the smaller of the two electrodes receives the greatest ionic bombardment. As the ions are accelerated substantially perpendicularly between the two electrodes and parallel to the electric field, the ions collide with the wafer perpendicularly to the wafer's surface.

High-density remote-source reactors, another type of single wafer etch reactor, are of a more recent design and are preferred for certain applications. Such a reactor is similar to a parallel plate reactor in that the wafer is affixed to a base electrode. The upper electrode, however, is replaced by the grounded walls of the etch chamber. A high-density plasma is generated by either a Mori source, a helicon source, or an electron cyclotron resonance source in a remote chamber which adjoins the etch chamber. As the high-density plasma escapes from the source chamber and migrates into the etch chamber, its density decreases and its spacial uniformity increases. The less dense plasma within the etch chamber receives additional power from the powered wafer chuck during the etch process. Power coupling between the wafer chuck and the cylindrical sidewall causes reactive ions to be accelerated through a dark space that is established just above the surface of the wafer, permitting ion-assisted etching of etchable material on the surface of the wafer to occur. The amount of power supplied to the wafer chuck greatly influences etch rates, etch uniformity, and profile control.

Plasma etches can proceed by two basic mechanisms. The first, chemical etching, involves the following steps:

1) radicals (reactive species having no charge associated therewith) are generated in the plasma;
2) these radicals diffuse to the surface of the material being etched;
3) the radicals are adsorbed on the surface;
4) a chemical reaction occurs, with the formation of a volatile by-product;
5) the by-product is desorbed from the surface; and
6) the desorbed species diffuse into the bulk of the gas.

The second basic method, reactive-ion etching, involves the following steps:

1) reactive ions are created in the plasma;
2) the ions are accelerated vertically by the electric field between the electrodes;
3) the ions collide with the surface being etched;
4) the ions react with the material at the various collision sites to form volatile by-products;
5) the by-product is desorbed from the surface; and
6) the desorbed species diffuse into the bulk of the gas.

Generally, both chemical etching and reactive-ion etching occur during the operation of a parallel-plate reactor, as the bias between the plates is also responsible for generating the plasma. Thus, the complete plasma etch process within a parallel-plate reactor is more appropriately termed an ion-assisted etch process. For certain applications, this dual nature of the etch is a disadvantage, as chemical etching, alone, may be required. Although the chemical nature of the etch increases as the number of ionic species relative to the number of radical species present in the plasma decreases, it is difficult to eliminate all reactive ions from the plasma. Another disadvantage of the parallel-plate reactors is that the voltage required to sustain the plasma is far higher than is required to etch polycrystalline silicon or single-crystal silicon. In fact, the voltage is so high that ions acquire energies sufficient to etch silicon dioxide. For this reason, it is very difficult to perform an etch of silicon that stops on a silicon dioxide layer using a parallel-plate reactor. For such applications, a new type of plasma reactor, known as a high-density-remote-source plasma reactor has been developed.

In single-wafer reactors such as parallel plate reactors and high-density-remote-source reactors, the base electrodes typically have a set of at least three vertically-oriented spaced-apart lifting pins which may be simultaneously raised and lowered. When in the lowered position, the lifting pins are fully retracted in base electrode body so that the wafer rests on the upper surface of the electrode. When the lifting pins are extended, the wafer is elevated above the base electrode so that a wafer handler may slide beneath the wafer in order to load and unload the wafer from the chamber.

During the fabrication of integrated circuits it is often necessary to remove a film that has been deposited or grown on the backside of the wafer. Backside films are most easily removed by coating the in-process circuitry on the face of the wafer with photoresist resin and then removing the backside film with a wet etch. However, it is very difficult to remove certain films such as silicon nitride using a wet etch while the face of the wafer is coated with photoresist resin. A silicon nitride wet etch requires a phosphoric acid solution heated to a temperature between 140° and 160° C. At such a temperature, the phosphoric acid will dissolve the photoresist coating on the face of the wafer and damage the circuitry.

Because of the aforementioned difficulties, backside silicon nitride films are typically removed by subjecting the wafers to a plasma etch in a barrel-type batch etcher. Such an etcher typically has a tube-shaped etch chamber with its axis oriented horizontally. The chamber is equipped with a pair of external electrodes, each electrode shaped like a stave from a cylindrical barrel, and each electrode spanning the length of the chamber. One electrode is located on top of the chamber, the other below. Multiple wafers are loaded into a quartz fixture and placed in the chamber, with the face and backside of each wafer being positioned perpendicular to the chamber axis. With the wafers loaded, the chamber sealed, the flow of one or more gases through the chamber established, a plasma is ignited within the chamber to perform the etch. As wafer diameters increase to 200 mm, then to 300 mm and beyond, etch uniformity will become increasingly difficult to achieve. Although greater backside etch uniformity has been achieved by elevating the wafer above the wafer chuck with the lifting pins so that it is positioned within the plasma, the regions of the wafer that rest on the ends of the pins may not etch completely. Even if the ends of the pins are sharpened, the etch may still leave bumps on the back of the wafer. Such bumps may create an uneven focal plane on the face of the wafer at a subsequent photolithographic stage in the wafer fabrication process.

SUMMARY OF THE INVENTION

The present invention has as its objectives the provision of a method and apparatus, adaptable to plasma etchers for removing films such as silicon nitride from the backside of semiconductor wafers having parallel, opposed front and back side surfaces bounded by a perimetric edge without leaving unetched residue or bumps on the back side surface.

In accordance with this invention, the aforementioned method is implemented by loading a semiconductor wafer in a plasma etch chamber and subjecting the front and back side surfaces of the wafer to an etchant plasma for a period of time while supporting the wafer elevated above the base electrode, in such a manner that all portions of the front surface and all portions of the back side surface are exposed to the plasma for at least a portion of the period.

In a first embodiment of the method, the wafer is supported by mechanical, wafer-supporting force applied to at least three locations along the perimetric edge.

In a second embodiment of the method, the back side surface has first and second sets of contact locations, and the front and back sides of the wafer are subjected to the plasma while supporting contact for the wafer is alternately provided at the contact locations of the first and second sets.

In accordance with this invention, the apparatus for facilitating removal of films from the backside surface of a semiconductor wafer is a wafer support structure which may be incorporated in a base electrode assembly. The support structure is adapted to support a semiconductor wafer elevated above the upper surface of the main body of the base electrode, in such a manner as to expose all portions of the back side surface to a plasma during an etch operation.

A first embodiment of the wafer support structure includes at least three vertically oriented posts which are spaced around the perimeter of the wafer and are upwardly extensible from storage recesses within the main body of the base electrode. When extended the main body, each of the posts is adapted to apply a wafer-supporting mechanical force toward the center of the wafer at a location on the perimetric edge, thereby exposing all portions of the back side surface to the plasma during a plasma etch operation.

A second embodiment of the wafer support structure includes first and second sets of at least three vertically oriented support pins which are attached to and elevable above the main body of the base electrode. At least one of the sets of support pins is retractably mounted within recesses in the base electrode. The first set of support pins contacts the back side surface at a first set of contact locations, while the second set of support pins contacts the back side surface at a second set of contact locations. During a plasma etch, the first and second sets of contact locations are alternately exposed to the plasma during a plasma operation.

A third embodiment of the wafer support structure includes at least three vertically oriented support pins, and a rotating pedestal upwardly extensible from the base electrode main body. The rotating pedestal is adapted to lift and rotate the wafer about its central axis so that a first set of contact locations on the back side surface initially in contact with the support pins during a plasma etch operation may be subsequently exposed to the plasma while the wafer is in contact with a second set of contact locations on the back side surface.

DETAILED DESCRIPTION OF THE INVENTION

Figure 1:
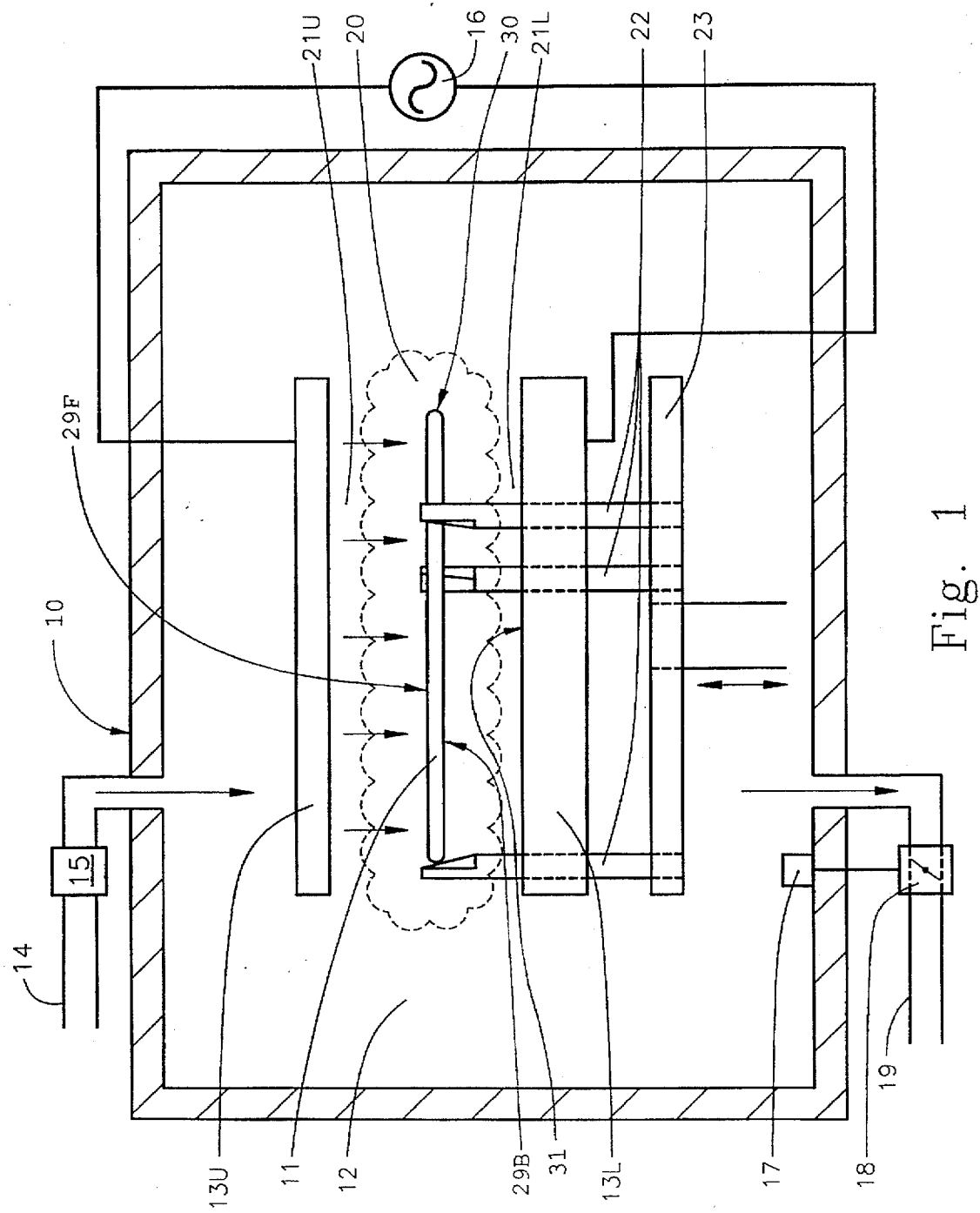
FIG. 1 is a diagrammatic representation of a typical parallel-plate plasma etch reactor incorporating a first embodiment of the new base electrode assembly with a wafer support structure that supports the wafer at multiple locations about the perimetric edge.
Figure 2:
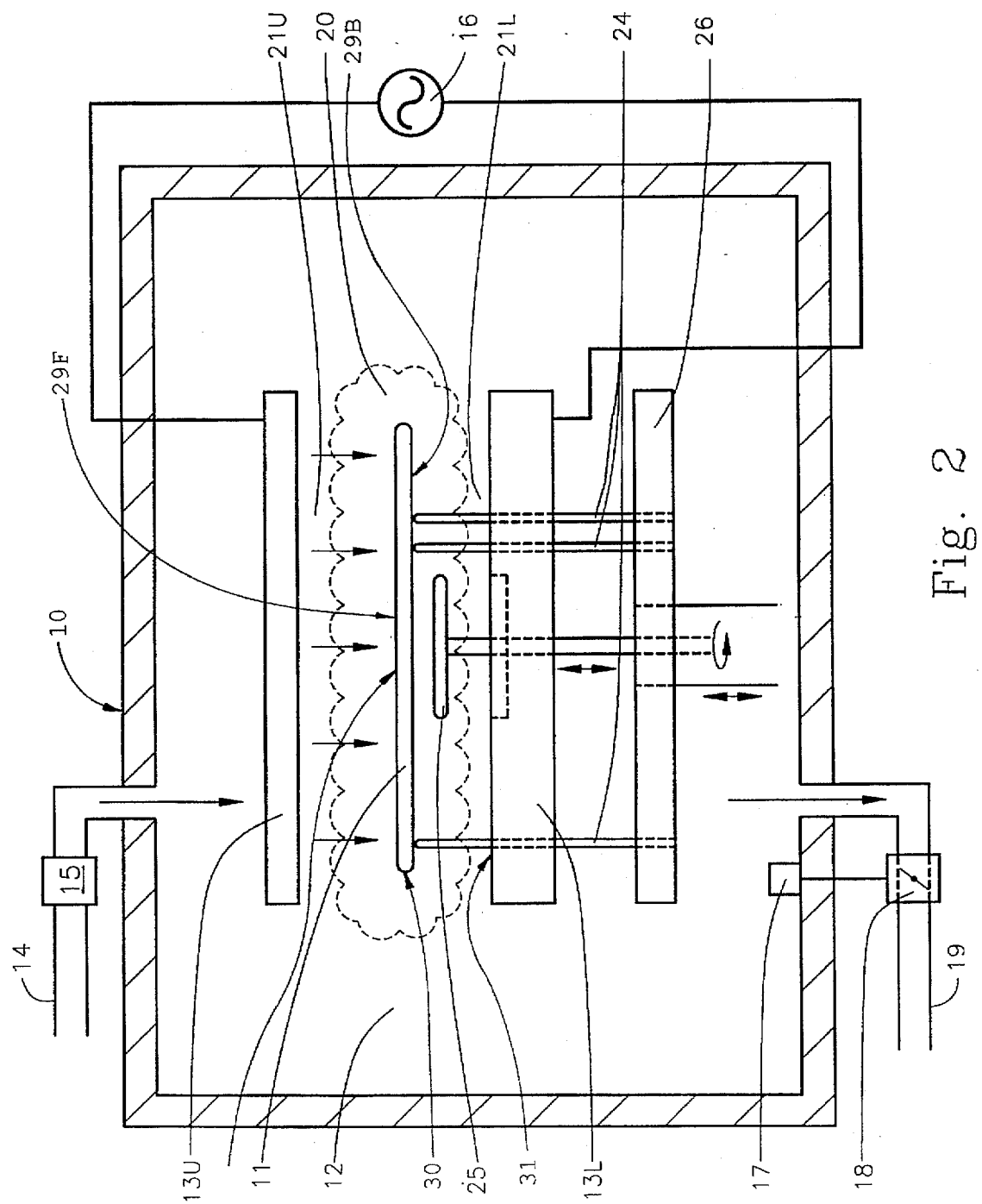
FIG. 2 is a diagrammatic representation of a typical parallel-plate plasma etch reactor incorporating a second embodiment of the new base electrode assembly with a wafer support structure having a single set of wafer support pins and a retractable rotating pedestal.
Figure 3:
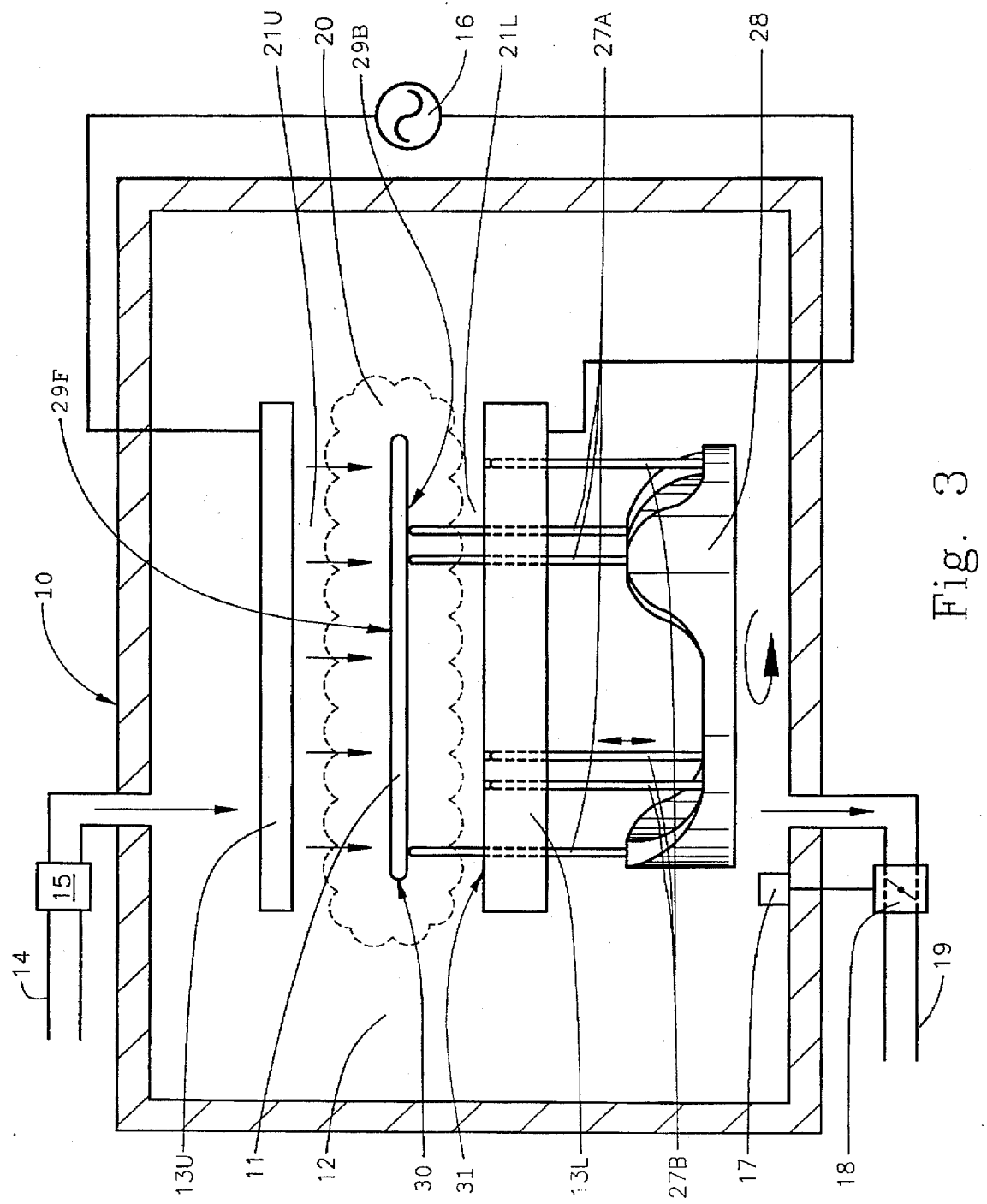
FIG. 3 is a diagrammatic representation of a typical parallel-plate plasma etch reactor incorporating a third embodiment of the new base electrode assembly with a support structure having two sets of independently elevable wafer support pins.

Referring now to FIGS. 1, 2 and 3, the present invention provides embodiments of both a method and an apparatus, particularly adaptable to a plasma etcher 10 having horizontally-oriented base electrodes 13L, for removing films such as silicon nitride from the backside surface 29B of a semiconductor wafer 11 having parallel and opposed front and back side surfaces, 29F and 29B respectively, bounded by a perimetric edge 30, without leaving unetched residue or bumps on the back side surface 29B.

The following brief explanation of the operation of a parallel plate plasma reactor is intended to help the reader better understand the invention. Referring to FIG. 1 or FIG. 2 or FIG. 3, a disk-shaped upper electrode 13U is positioned above the wafer (the number 13* applies to either 13L or 13U). The flow of molecular gas into the chamber 12 through intake manifold 14 is automatically regulated by highly-accurate mass-flow controllers 15. A radio-frequency voltage 16 is applied between electrodes 13L and 13U. Chamber pressure is monitored and maintained continuously through a feedback loop between a chamber manometer 17 and a downstream throttle valve 18, which allows reactions products and surplus gas to escape in controlled manner through exhaust manifold 19. Spacing of the electrodes 13* is controlled by a closed-loop positioning system (not shown).

At a particular voltage known as the breakdown voltage, a glow discharge will be established between the electrodes, resulting in a partial ionization of the molecular gas. In such a discharge, free electrons gain energy from the imposed electric field and lose this energy during collisions with molecules. Such collisions lead to the formation of new species, including metastables, atoms, electrons, free radicals, and ions. The electrical discharge between the electrodes consists of a glowing plasma region 20 centered between base electrode 13L and upper electrode 13U, a lower dark space 21L between the base electrode 13L and plasma region 20, and an upper dark space region 21U between the upper electrode 13U and plasma region 20. Dark space regions 21* are also known as "sheath" regions.

Electrons emitted from the electrodes 13* are accelerated into the discharge region. By the time the electrons have reached the plasma region 20, they have acquired sufficient kinetic energy to ionize some of the molecular gas molecules and raise the electrons of other molecular gas molecules to less-stable atomic orbitals of increased energy through a mechanism known as electron impact excitation. As each of these excited electrons "relaxes" and falls back to a more stable orbital, a quantum of energy is released in the form of light. This light gives the plasma region its characteristic glow. Free electrons may also collide with species already formed by collisions between free electrons and gas molecules, leading to additional subspecies. Because free electrons have little mass, they are accelerated much more rapidly toward the electrodes than are ionized gas molecules, leaving the plasma with a net positive charge. The voltage drop through the plasma is small in comparison to the voltage drops between the plasma and either of the plates at any given instant of an AC voltage cycle. As acceleration of ions within the plasma region 20 is therefore minimal, plasma ions which are accelerated from the plasma to one of the plates are primarily those that happen to be on the edge of one of the dark spaces.

Because the ions are accelerated substantially perpendicularly between the two electrodes (parallel to the electric field), the ions will collide with the wafer perpendicularly to the wafer's surface when the wafer is affixed to the upper surface of the base electrode 13L. As an ion collides with an atom or molecule of reactive material on the wafer, the two may react to form a reaction product. Because ion bombardment of the electrodes with ions and electrons causes an elevation of electrode temperature, both electrodes are normally cooled by the circulation of deionized water through the electrodes and an external temperature control unit (not shown). Water cooling prevents elevation of wafer temperature to levels which would destabilize photoresist.

The present invention is aimed at facilitating the complete removal of deposited material from the backside surface 29B of a wafer 11 by positioning the wafer 11 with the entire backside surface 29B exposed within the glowing plasma region 20 where there is little ion bombardment and etching is primarily isotropic.

The method for removing deposited films from the backside surface of a wafer includes the steps of: loading the wafer 11 in the etch chamber 12 of a plasma etcher 10; subjecting the front and back side surfaces, 29F and 29B respectively, to an etchant plasma 20 for a period of time while supporting the wafer 11 elevated above the upper surface 31 of a base electrode 13L so that all portions of the front side surface 29F and all portions of the back side surface 29B are subjected to the plasma 20 for at least a portion of the period.

The apparatus for facilitating the removal of films from the back side of a semiconductor wafer is embodied in a wafer support structure which may be affixed to and incorporated into the base electrode 13L. The support structure is adapted to support a semiconductor 11 wafer elevated above the upper surface of the base electrode 13L in a manner that provides exposure to all portions of the back side surface 29B during a plasma etch operation. Although each of the three preferred embodiments of the wafer support structure of FIGS. 1, 2 and 3 are shown as having been incorporated in a parallel plate plasma etcher 10, it should be understood that the invention may also be incorporated in a remote source plasma reactor or any other plasma reactor having a horizontally-oriented base electrode. Each preferred embodiment of the wafer support structure is designed such that a semiconductor wafer 11 may be affixed directly to the upper surface 31 of the base electrode 13L or supported above the upper surface 31 by the wafer support structure. The base electrode in combination with the wafer support structure may be considered a base electrode assembly, as the base electrode 13L must be modified in order to accommodate the wafer support structure.

Referring now to FIG. 1, a first embodiment of the new wafer support structure having at least three vertically oriented posts 22. The posts 22 are spaced around the perimetric edge 30 of the wafer 11 and are upwardly extensible from retracted positions within the base electrode 13L. Simultaneous extension and retraction of the posts 22 is accomplished by means of a vertically movable plunger plate 23 to which each post 22 is anchored. The end of each post 22 is tapered so as to apply a wafer-supporting mechanical contact toward the center of the wafer at a location on the perimetric edge 30, the force of contact being equal to that applied by the wafer edge 30 against the post 22 as a consequence of the downward gravitational force exerted on the wafer 11. For this first embodiment, all portions of the back side surface 29B are continuously exposed to the plasma 20 during the etch process. Incomplete removal of material on the perimetric edge 30 will not affect depth of field focusing during later masking steps.

Referring now to FIG. 2, a second embodiment of the wafer support structure features a single set of at least three vertically oriented support pins 24, which are fully retractable into base electrode 13L, and a rotating pedestal 25 upwardly extensible from the base electrode 13L. The rotating pedestal 25 is adapted to lift and rotate the wafer 11 about its central axis so that a first set of contact locations on the back side surface initially in contact with the support pins during a plasma etch operation may be subsequently exposed to the plasma while the wafer is in contact with a second set of contact locations on the back side surface during the same etch operation. The wafer 11 may be raised and rotated and then lowered numerous times during the etch process so that the backside surface contacts a given set of contact locations for only a small portion of the total etch period. The rotating pedestal 25 may be indexed so that the wafer may be returned to the rotational position it had when originally loaded within the etch chamber. The wafer, itself, is indexable by means of a flat portion of its circumferential, perimetric edge. Similar to the arrangement for raising and lowering the posts 22 of FIG. 1, the support pins 24 are anchored in a vertically movable plunger plate 26.

Referring now to FIG. 3, a third embodiment of the wafer support structure includes at least first and second sets of at least three vertically oriented support pins, 27A and 27B respectively. At least one of the sets of support pins is retractably mounted within the base electrode 13L (both sets depicted in FIG. 3 are fully retractable). The first set of support pins 27A contacts the back side surface at a first set of contact locations, while the second set of support pins 27B contacts the back side surface at a second set of contact locations, which do not overlap the first set of contact locations. For this second embodiment, the first and second sets of contact locations are alternately exposed to the plasma during the etch process. A horizontally rotatable cam plate 28 provides alternate raising and lowering of each set of support pins.

For a less preferred variant of the third embodiment of the apparatus wherein one set of wafer support pins is rigidly affixed to the upper surface of the base electrode, and the other set of wafer support pins is both extensible above the upper surface of the base electrode and retractable into the main body of the electrode, the uppermost tip of each pin of the retractable set has a raised elevation that is higher than that of the uppermost tip of each pin of the rigidly affixed set and a lowered elevation that is lower than that of the uppermost tip of each pin of the rigidly affixed set. Such an arrangement will allow the wafer to be supported by pins of either set without being in contact with pins of the other set.

The pins, posts and rotating pedestal disclosed in FIGS. 1 through 3 are fabricated from materials which are highly resistant to attack by the plasma. The following materials are satisfactory for the indicated etches: For silicon dioxide and silicon nitride etches, anodized aluminum; for chlorine-based plasmas used for polycrystalline silicon, quartz; and for fluorine-based etches, silicon. Other materials from which the pins may be fabricated are silicon carbide and metal, silicon and quartz pins coated with a diamond layer using chemical vapor deposition.

Although only several embodiments of the apparatus and method for facilitating the removal of deposited films from the backside surface of wafers are disclosed herein, it should be understood that the embodiments presented are meant to be illustrative and not limiting. Those having ordinary skill in the art of plasma etching will recognize that changes and modifications may be made to either the method or the apparatus without departing from the scope and the spirit of the invention as hereinafter claimed. For example, other mechanisms for raising and lowering the support pins and the edge supporting posts can be easily devised. Additionally, other more complicated devices may be designed for supporting a wafer by its perimetric edge. Such devices may not necessarily be incorporated in the base electrode, but may be attached to and extensible from the sidewalls of the etch chamber.

We claim:

1. A method, for removing deposited films from a backside surface of a semiconductor wafer, said wafer having opposed front and back sides, said method comprising the steps of:

(a) loading the wafer in a plasma etch chamber, said chamber having a base electrode;

(b) positioning said wafer elevated above the base electrode;

(c) supporting said wafer at a first set of contact locations on said back side surface;

(d) subjecting both sides of said wafer to an etchant plasma while supporting said wafer at said first set of contact locations;

(e) supporting said wafer at a second set of contact locations on said back side surface;

(f) subjecting both sides of said wafer to the etchant plasma while supporting contact is provided only at each contact location of said second set.

2. The method of claim 1, wherein said second set of contact locations do not overlap said first set of contact locations.

3. The method of claim 1, wherein the plasma is extinguished while supporting contact is shifted from the contact locations of the first set to contact locations of the second set.

4. The method of claim 1, whereby the plasma remains ignited while supporting contact is shifted from the contact locations of the first set to those of the second set.

5. The method of claim 1, wherein supporting contact is alternately provided by first and second sets of at least three vertically oriented support pins per set, at least one of said sets of support pins being retractably mounted within the base electrode, said first set of support pins contacting the back side at only the contact locations of said first set of contact locations and said second set of support pins contacting the back side at only the contact locations of said second set of contact locations.

6. The method of claim 1, wherein support for the wafer is provided by a single set of at least three vertically oriented support pins affixed to the base electrode, the wafer is rotatable on a pedestal extensible from the base electrode, said single set of support pins initially touch the contact locations of the first set, and subsequent to rotation of the wafer on the pedestal, touch contact locations of the second set.

7. A method, for removing deposited films from a back side surface of a semiconductor wafer having first and second sets of contact locations, said method comprising the steps of:
 (a) loading the wafer in a plasma etch chamber, said chamber having a base electrode, said wafer having opposed front and back side surfaces;
 (b) subjecting said front and back side surfaces to an etchant plasma for a period of time while supporting said wafer elevated above the base electrode by providing alternating supporting contact for said wafer at the contact locations of said first and second sets, all portions of said front surface and all portions of said back side surface being subjected to said plasma for at least a portion of said period.

8. The method of claim 7, whereby the plasma is extinguished while support of said wafer is transferred from one set of support pins to another set.

9. The method of claim 7, whereby the plasma remains ignited while support of said wafer is transferred from one set of support pins to another set.

10. In combination with a plasma etcher, a base electrode assembly comprising:
 (a) a main body having an upper surface;
 (b) a wafer support structure attached to said upper surface for supporting a semiconductor wafer elevated above said upper surface, said wafer having front and back side surfaces bounded by a perimetric edge, said wafer support structure comprising at least three vertically oriented posts, said posts being spaced around the perimeter of the wafer and extensible from the main body, each of said posts adapted to apply a wafer-supporting mechanical contact toward the center of the wafer at a location on the perimetric edge.

11. In combination with a plasma etcher, a base electrode assembly comprising:
 (a) a main body having an upper surface;
 (b) a wafer support structure attached to said upper surface for supporting a semiconductor wafer elevated above said upper surface, said wafer having front and back side surfaces, said wafer support structure comprising first and second sets of vertically oriented support pins, each set having at least pins, at least one of said sets of support pins being retractably mounted within the base electrode, said first set of support pins contacting the back side at a first set of contact locations, said second set of support pins contacting the back side at a second set of contact locations, the contact locations of said second set of contact locations not overlapping the contact locations of said first set of contact locations.

12. In combination with a plasma etcher, a base electrode assembly comprising:
 (a) a main body having an upper surface;
 (b) a wafer support structure attached to said upper surface for supporting a semiconductor wafer elevated above said upper surface, said wafer having front and back side surfaces, said wafer support structure comprising a single set of at least three vertically oriented support pins, and said base electrode assembly further comprises a rotating pedestal upwardly extensible from the main body, said rotating pedestal adapted to lift and rotate the wafer about a central axis so that locations on the back side surface initially in contact with the support pins during a plasma etch operation may be subsequently exposed during the same etch operation.

13. In combination with a plasma etcher, a base electrode assembly comprising:
 (a) a main body having an upper surface; and
 (b) first and second sets of at least three vertically-oriented support pins per set, each of said pins being affixed to and extensible above said upper surface, each of said pins having an upper most tip adapted for wafer contact, the pins of at least one of said two sets being retractable into said main body, each set of pins being suited to independently support a semiconductor wafer having front and back side surfaces by contacting the wafer at locations on the back side surface that are unique to each set.

14. The base electrode assembly of claim 13, wherein said main body has a planar horizontally-oriented upper surface adapted for supporting a semiconductor wafer, each of said sets of support pins is extensible above said upper surface and retractable into said main body such that said wafer may be supported on either set of support pins above said upper surface or on said upper surface.

15. The base electrode assembly of claim 13, wherein a first set of wafer support pins is rigidly affixed to said upper surface and a second set of wafer support pins is both extensible above said upper surface and retractable into said main body, the uppermost tip of each pin of said second set having both a raised elevation that is higher than that of the uppermost tip of each pin of the first set and a lowered elevation that is lower than that of the uppermost tip of each pin of the first set.

16. A method, for removing deposited films from a back side surface of a semiconductor wafer, said method comprising the steps of:
 (a) loading the wafer in a plasma etch chamber, said chamber having a base electrode, said wafer having opposed front and back side surfaces bounded by a perimetric edge;
 (b) subjecting said front and back side surfaces to an etchant plasma for a period of time while supporting said wafer elevated above the base electrode by mechanical force applied to at least three locations along the perimetric edge, all portions of said front surface and all portions of said back side surface being subjected to said plasma for said period.

* * * * *